(12) United States Patent
Levy

(10) Patent No.: US 8,440,992 B2
(45) Date of Patent: May 14, 2013

(54) ULTRAHIGH DENSITY PATTERNING OF CONDUCTING MEDIA

(75) Inventor: Jeremy Levy, Pittsburgh, PA (US)

(73) Assignee: University of Pittsburgh—of the Commonwealth System of Higher Education, Pittsburgh, PA (US)

( * ) Notice: Subject to any disclaimer, the term of this patent is extended or adjusted under 35 U.S.C. 154(b) by 81 days.

(21) Appl. No.: 13/107,242

(22) Filed: May 13, 2011

(65) Prior Publication Data
US 2011/0215289 A1    Sep. 8, 2011

Related U.S. Application Data

(63) Continuation of application No. 12/054,948, filed on Mar. 25, 2008, now Pat. No. 7,999,248.

(60) Provisional application No. 60/908,084, filed on Mar. 26, 2007.

(51) Int. Cl.
*H01L 29/76* (2006.01)

(52) U.S. Cl.
USPC .... 257/9; 257/24; 257/E27.071; 257/E51.023

(58) Field of Classification Search ................ 257/9, 24, 257/40, 142, E23.142, E27.071, E51.023, 257/E51.04; 977/943
See application file for complete search history.

(56) References Cited

U.S. PATENT DOCUMENTS 5,252,835 A    10/1993  Lieber et al.
2008/0061284 A1    3/2008  Chu et al.

FOREIGN PATENT DOCUMENTS
WO    WO 00/41213    7/2000

OTHER PUBLICATIONS

Harold Y. Hwang, "Tuning Interface States", Science 313, 1895 (2006).*
Huijben et al., "Electronically coupled complementary interfaces between perovskite band insulators", Nature Materials 5, 556 (Jul. 2006).*
Y. Nagamune et al., "Single electron transport and current quantization in a novel quantum dot structure", Applied Physics Letters, 64 (18), May 2, 1994, pp. 2379-2381.
Seigo Tarucha et al., "Elastic and Inelastic Single Electron Tunneling in Coupled Two Dot System", Microelectric Engineering 47 (1999) 101-105.
R. Held et al., "In-Plane gates and nanostructures fabricated by direct oxidation of semiconductor heterostructures with an atomic force microscope", Applied Physics Letters, vol. 73, No. 2, Jul. 13, 1998, pp. 262-264.
G. Valdre et al., "Controlled positive and negative surface charge injection and erasure in a GaAs/AlGaAs based microdevice by scanning probe microscopy", Nanotechnology 19 (2008)1-6.

(Continued)

*Primary Examiner* — Thomas L Dickey
(74) *Attorney, Agent, or Firm* — Foley & Lardner LLP

(57) ABSTRACT

A reconfigurable device and a method of creating, erasing, or reconfiguring the device are provided. At an interface between a first insulating layer and a second insulating layer, an electrically conductive, quasi one- or zero-dimensional electron gas is present such that the interface presents an electrically conductive region that is non-volatile. The second insulating layer is of a thickness to allow metal-insulator transitions upon the application of a first external electric field. The electrically conductive region is subject to erasing upon application of a second external electric field.

16 Claims, 5 Drawing Sheets

OTHER PUBLICATIONS

A. Ohtomo et al., "A high-mobility electron gas at the LaAlO3/SrTiO3 heterointerface", Nature, vol. 427, Jan. 29, 2004, pp. 423-426.
C. Cen et al., "Nanoscale control of an interfacial metal-insulator transition at room temperature", Nature Materials, 2008, pp. 1-5.
S. Thiel et al., "Tunable Quasi-Two Dimensional Electron Gases in Oxide Heterostructures", Science, vol. 313, Sep. 29, 2006, pp. 1942-1945.

Final Office Action U.S. Appl. No. 12/054,948 dated Jan. 6, 2011.
Notice of Allowance U.S. Appl. No. 12/054,948 dated Apr. 11, 2011.
Non-Final Office Action U.S. Appl. No. 12/054,948 dated Jul. 20, 2010.
Non-Final Office Action U.S. Appl. No. 12/054,948 dated Sep. 28, 2010.

* cited by examiner

ULTRAHIGH DENSITY PATTERNING OF CONDUCTING MEDIA

CROSS-REFERENCE TO RELATED PATENT APPLICATIONS

This application is a continuation of U.S. patent application Ser. No. 12/054,948, filed Mar. 25, 2008, now U.S. Pat. No. 7,999,248 which claims priority to U.S. provisional patent application No. 60/908,084, filed Mar. 26, 2007. The disclosures of the foregoing applications are incorporated here by reference, in their entirety.

STATEMENT REGARDING FEDERALLY SPONSORED RESEARCH

This invention was made with Government support under grant number 19-01-1-0650 and under grant number 0704022, awarded by DARPA-DAAD and the National Science Foundation, respectively. The government has certain rights in the invention.

BACKGROUND OF THE INVENTION

The success of semiconductors as technologically useful materials, is based on three important features: (1) the electrical conductivity of the semiconductor, especially the ability to readily tune the conductivity of the semiconductor materials; (2) the ability to readily create insulating layers, that would enable the fabrication of field-effect devices; (3) the ability to reproducibly create various field-effect devices having nanoscale dimensions. Although oxide materials have been identified that combine many of the important electronic properties of semiconductors, such as interfacial superconductivity, strain-driven ferroelectricity, interfacial ferromagnetism and colossal magnetoresistance, there still exists a need for devices having nanoscale dimensions as well as methods that allow the fabrication of such devices.

It should be noted that the information provided here is intended solely to assist the understanding of the reader. None of the information provided or the publications cited is admitted to be prior art to the present invention. Each of the cited publications is incorporated by reference in its entirety.

SUMMARY OF THE INVENTION

In accordance with one aspect of the invention, a reconfigurable device is provided. The device includes (A) a first insulating layer that and a second insulating layer and, at an interface between the first and second insulating layers, (B) an electrically conductive, quasi one- or zero-dimensional electron gas, such that the interface presents an electrically conductive region that is non-volatile. The second insulating layer is of a thickness to allow metal-insulator transitions upon the application of a first external electric field, and wherein the electrically conductive region is subject to erasing upon application of a second external electric field.

The electrically conductive region can form a nanowire or a quantum dot. In one embodiment, the electrically conductive region has a nanoscale width or diameter, such as a width or a diameter of less than 20 nm. For instance, the electrically conductive region can have a width or a diameter in the range of about 3.3 nm to about 10 nm. In another instance, the width or diameter is about 3.3 nm. Furthermore, electrically conductive region can have a length of about 100 nm to about 100 μm.

In an embodiment of the invention, the electrically conductive region comprises a gate of a transistor, a channel of a transistor, a data storage region of a data storage device, an interconnect or electrode of an electronic device or a conductive region of a passive electronic device.

In a further embodiment, the first insulating layer comprises a non-polar oxide material and the second insulating layer comprises polar oxide material that overlays the first insulating layer. Thus, the two insulating layers can include materials having perovskite structures which are different from each other. In another instance, the non-polar oxide material includes $SrTiO_3$ and the polar oxide material is selected from the group consisting of $LaTiO_3$, $LaAlO_3$, $LaVO_3$ and $KTaO_3$. The thickness of the polar oxide material can be three unit cells, for example.

Pursuant to another aspect of the invention, a method is provided for making or using a reconfigurable device is provided. The reconfigurable device includes (A) a first insulating layer and a second insulating layer and, at an interface between the first and second insulating layers, (B) an electrically conductive, quasi one- or zero-dimensional electron gas, such that the interface presents an electrically conductive region that is non-volatile. The second insulating layer is of a thickness to allow metal-insulator transitions upon the application of a first external local electric field, and the method comprises providing a first external local electric field adjacent to the interface to create the electrically conductive, quasi one- or zero-dimensional electron gas. The electrically conductive region of the device is subject to erasing upon application of a second external local electric field.

The first external local electric field can be applied by a tip of an atomic force microscope (AFM). In another embodiment, the first external local electric field is applied by an electron beam or by a nanoscale electrode.

The methodology of the invention further can comprise erasing the electrically conductive region by applying the second external local electric field adjacent to the electrically conductive region, where the second external local electric field is of an opposite polarity to the first external local electric field. For instance, the first and the second external local electric fields can be applied to the interface through one of the first and second insulating layers.

In one embodiment of the invention, the first and second insulating layers include $LaAlO_3$ and $SrTiO_3$, and the first external local electric field is applied through the $LaAlO_3$ layer.

In another embodiment, the electrically conductive region retains its conductivity for at least 12 hours to provide a useful function, after the withdrawal of the first external local electric field.

The inventive method also can include the reconfiguring of the reconfigurable device, mentioned above. This can be accomplished by selectively creating or erasing multiple electrically conductive regions, using external local electric fields, as noted.

DETAILED DESCRIPTION OF THE INVENTION

Figure 1:
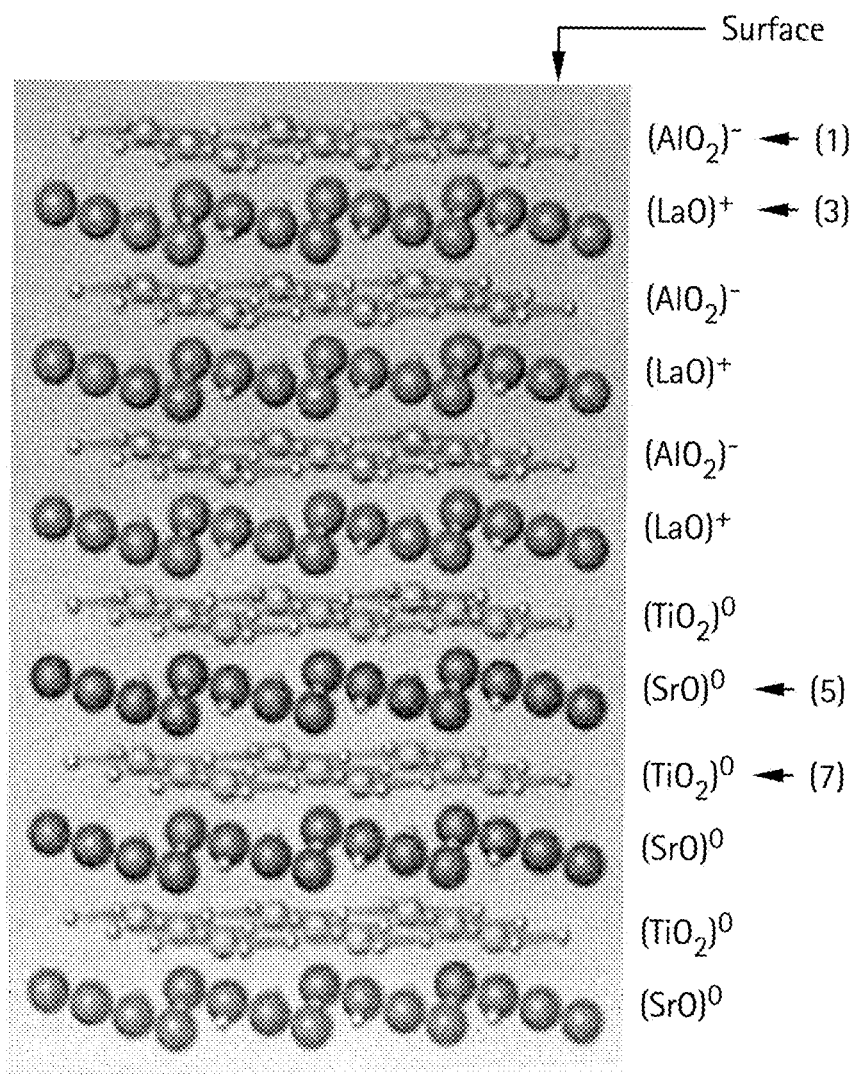
FIG. 1 is a schematic diagram of the $LaAlO_3/SrTiO_3$ heterostructure. The oxide heterostructure comprises alternating layers of $(AlO2)^-$ (1) and $(LaO)^+$ (3), so as to form a polar insulating layer of lanthanum aluminate that is grown epitaxially onto a non-polar strontium titanate insulating layer formed of SrO (5) and $TiO_2$ (7) layers.

The present invention relates to a device having nanoscale dimensions, as well as to a method for creating such a device. Specifically, the present invention relates to nanoscale devices comprising quasi one- or zero-dimensional electron gas at the interface between insulating oxide layers. In this context, the phrase "electron gas" refers to small isolated "puddles" of conducting electrons, see Finkelstein, et al., Science, 2000, 289, 90, that form locally at the interface between the insulating oxide layers, pursuant to the invention, upon the application of an external electric field by means of an atomic force microscope.

Before particular embodiments of the invention are described, it is to be understood that the particular materials, methods for making the device and uses thereof are being presented by way of examples. The materials and methods for making of the device may vary to some degree. It is also understood that the terminology used herein is for the sole purpose of describing particular embodiments of the invention and is not intended to be limiting. The scope of the present invention is determined by the appended listing of the claims and equivalents thereof.

In the context of applying local electric fields, the phrase "local field" refers to an electric field that is applied to a specific nanoscale portion or region of the oxide heterostructure having one dimension smaller than 1000 nm. Preferably, the electric field is applied to a region that is less than 100 nm wide, and preferably a region in the range from about 1 nm to about 20 nm wide.

The phrase "local metallic region" refers to an electrically conductive region that has a nanoscale dimension, such as a width of 1000 nm or less.

The phrase "oxide heterostructure" refers to a material system that consists of a polar insulating layer (e.g., LaAlO$_3$), grown epitaxially on to a non-polar insulating layer (e.g., SrTiO$_3$). Preferably, the polar insulating layer has a thickness that allows metal-insulator transition to occur in the presence of an external electric field. For a SrTiO$_3$/LaAlO$_3$ material system the thickness of the polar LaAlO$_3$ layer is preferably three unit cells.

The phrase "nanoscale electrode" refers to electrodes within a nanoscale portion or region of the oxide heterostructure, wherein the electrodes themselves have nanoscale dimensions.

The phrase "interconnect" refers, to a nanowire made using a conducting atomic force microscope to electrically connect two electronic or solid state devices, such as two transistors through an insulating layer.

The phrase "conductive region of passive device" refers to a nanowire which is an electrode of a capacitor, is the conductive portion of a resistor, or winds around a magnetic region in an inductor.

The phrase "perovskite structure" refers to a structure consisting of the general formula ABX$_3$. Compounds having a perovskite structure consist of 12-coordinated A$^{+2}$ atoms on the corner of a cube, octahedral X$^-$ anion in the center of the face edges, and a tetrahedral B$^{+4}$ ions in the middle of the cube.

The ability to induce metal-insulator transition at the interface between two insulating oxide layers through the application of an external electric field has been reported. See Thiel, Science, 2006, 313, 1942. A material system that allows electric field-induced, metal-insulator quantum phase transitions often comprises a polar oxide layer, e.g., LaAlO$_3$, LaTiO$_3$, LaVO$_3$ or KTaO$_3$, overlaying a non-polar oxide layer, such as SrTiO$_3$. Electronically, the metal-insulator transition in such a material system is due to the formation of a conductive electron gas at the interface between the insulating layers.

Figure 2A:
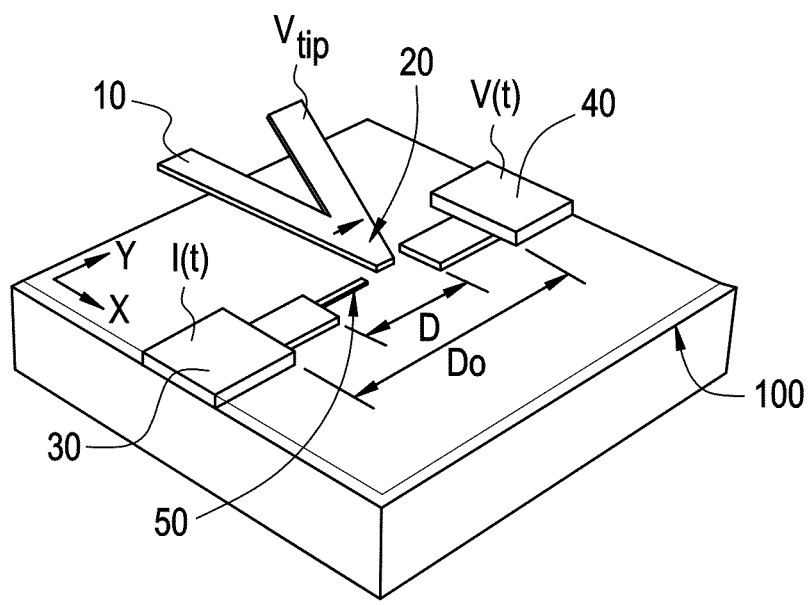
FIG. 2A is a schematic diagram for creating nanostructures, such as a wire nanostructure, using a conducting AFM probe (10). A voltage-biased AFM tip (20) is scanned from one electrode (30) towards a second electrode (40) in contact mode. The tip (20) generates an electric field that causes a metallic quasi-1DEG (q-1DEG) to form locally at the interface between the LaAlO$_3$ and SrTiO$_3$ layers.
Figure 3A:
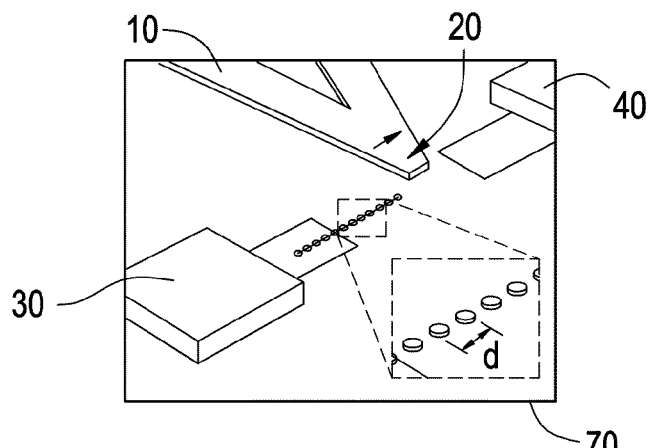
FIG. 3A is a schematic showing a linear array of conductive quantum dots (70) written with voltage pulses from the tip (20) of a conducting AFM.

As noted above, the present invention relates to a technologically useful nanoscale device, and to a methodology for creating and erasing nanoscale conducting structures, using tools that create local electric fields, such as the tip of a conducting AFM. The inventive method allows both isolated and continuous conducting features to be formed with length in a range well below 5 nm. One illustration of an isolated conducting feature is a conductive quantum dot as shown in FIG. 3A. A continuous conducting feature is exemplified by a nanowire connecting the electrodes as shown in FIG. 2A.

In one embodiment, the present invention provides a material system that comprises growing a polar insulating layer of LaAlO$_3$ onto a TiO$_2$-terminated insulating SrTiO$_3$ layer. According to one embodiment of the invention, the thickness of the LaAlO$_3$ layer is such, that it allows metal-insulator transitions upon the application of an external electric field. Preferably, the thickness is three unit cells. Samples of the oxide heterostructure prepared as described below were used for the metal-insulator transition studies. It should be noted that the thickness of the polar layer is important, as it allows eliminating conduction due to polar discontinuity.

In a further aspect of the instant invention, a conducting atomic force microscope (AFM) tip, is used to contact the top LaAlO$_3$ surface. The AFM tip is biased at voltage V$_{tip}$ with respect to the interface, and results in producing an interfacial metallic (V$_{tip}$>0) or insulating (V$_{tip}$<0) state directly below the area of contact. FIG. 1 shows a schematic view of the LaAlO$_3$/SrTiO$_3$ oxide heterostructure. As seen in FIG. 1, the heterostructure comprises alternate layers of (AlO2)$^-$ (1) and (LaO)$^+$ (3), so as to form a polar lanthanum aluminate layer that is grown epitaxially onto a non-polar strontium titanate insulating layer formed of SrO (5) and TiO$_2$ (7) layers.

Figure 2B:
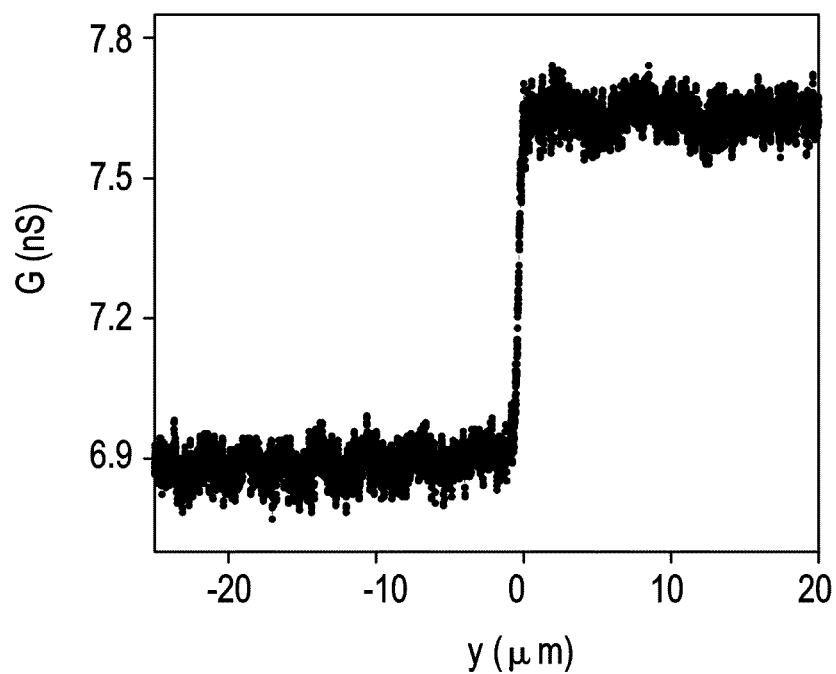
FIG. 2B is a graph of conductance as a function of the tip (20) position while writing a conducting wire (50) with a 3V bias applied to the tip. A steep increase in conductance occurs when the tip reaches the second electrode (40).

In another embodiment, the present invention provides a method for creating nanoscale electrically conductive region through the application of a local electric field at the surface of the LaAlO$_3$ layer which induces insulator-metal transition below the point of contact. Accordingly, the present invention discloses a device that is formed by contacting the LaAlO$_3$ layer with the source of an external electric field such as the tip of a conducting AFM, an electron beam or nanoscale electrode. FIG. 2A shows a schematic of the experimental set-up for writing a conducting wire (50) according to one embodiment of the instant invention. As shown in FIG. 2A the material system comprises an oxide heterostructure having a set of electrodes that are placed in contact with the interface, and separated from each other by a finite distance. A voltage-biased tip (20) of an AFM is then scanned from one electrode (30) towards the second electrode (40) in contact mode. The electric field generated by the tip causes a metallic quasi-1 or 0-dimensional electron gas (q-1DEG or q-0DEG) to form locally at the interface (100) between the LaAlO$_3$ and SrTiO$_3$ layers. In this embodiment of the invention the AFM tip was biased at a voltage of 3V and a lock-in amplifier was used to measure the conductance between the two electrodes. As shown in FIG. 2B, the measured conductance changes as a function of the tip position. Moving the AFM tip in contact mode towards the second electrode results in a steep increase in measured conductance, with a maximum conductance occurring when the AFM tip reaches the second electrode.

In still another embodiment, the present invention provides a method for creating and erasing nanowires and quantum dots using a conducting AFM tip (20) to create localized electrically conductive regions at the interface of the insulating layers. In a preferred embodiment the nanowires have a width less than 20 nm, more preferably a width in the range of about 3.3 nm to about 10 nm and even more preferably a width less than 6 nm, 5 nm and 4 nm. In a most preferred embodiment, the nanowire has a width of about 3.3 nm. In still another embodiment, the quasi-one-dimensional electrically conductive region has a length in the range of about 100 nm to about 100 µm, more preferably a length in the range of about 100 nm to at least about 10 µm and even more preferably a length less than 700 nm, 600 nm, 500 nm, 400 nm, 300 nm, and 200 nm. In a most preferred embodiment, the nanowire has a length of at least about 100 nm.

In still another embodiment, the conductive quantum dots have a diameter or width less than about 20 nm. Preferably the conductive quantum dots have a width or diameter in the range from about 1 nm to about 10 nm.

In still another embodiment, the conductive region formed at the interface of the insulating layers, retains its conductivity for a sufficiently long time interval after the withdrawal of the first external local electric field to provide useful function. In a preferred embodiment, conductivity is retained for at least about 12 h and more preferably from at least about 12 h to at least about 24 h and most preferably the conductive region retains its conductivity for a time interval greater than 24 h.

According to the embodiments of the present invention, the nanowires or quantum dots are buried at the interface of the two insulating materials. Thus, while it is believed that the nanowire or quantum dot is formed from the so-called one- or zero-dimensionally confined electron gas at the interface, it is possible that a physical arrangement or rearrangement of atoms at the interface may also contribute to or form the nanowire or quantum dot.

Figure 2C:
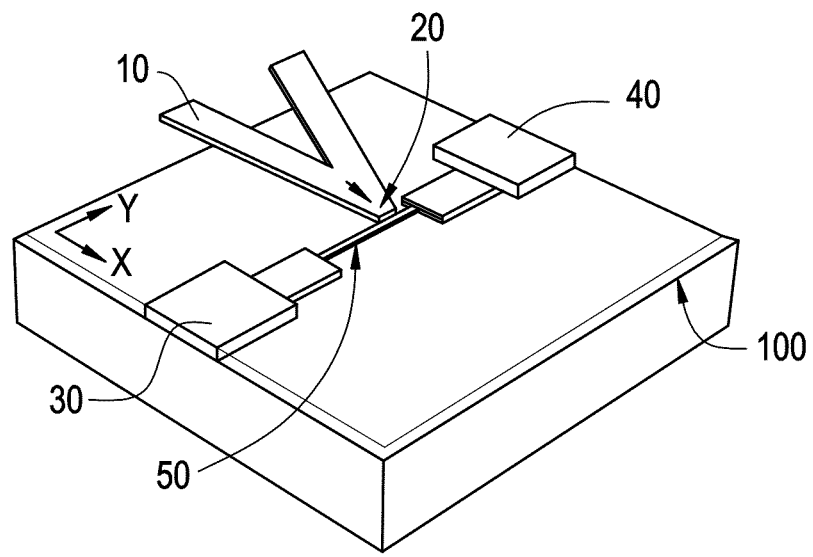
FIG. 2C is a schematic diagram of the experimental set up for cutting a conducting wire. A negatively biased AFM tip (20) moves in contact mode across the conducting wire (50). The tip erases the metallic q-1DEG locally when it crosses the conducting wire. The conductance between the two electrodes (30, 40) is monitored as the tip scans over the wire (50).
Figure 2D:
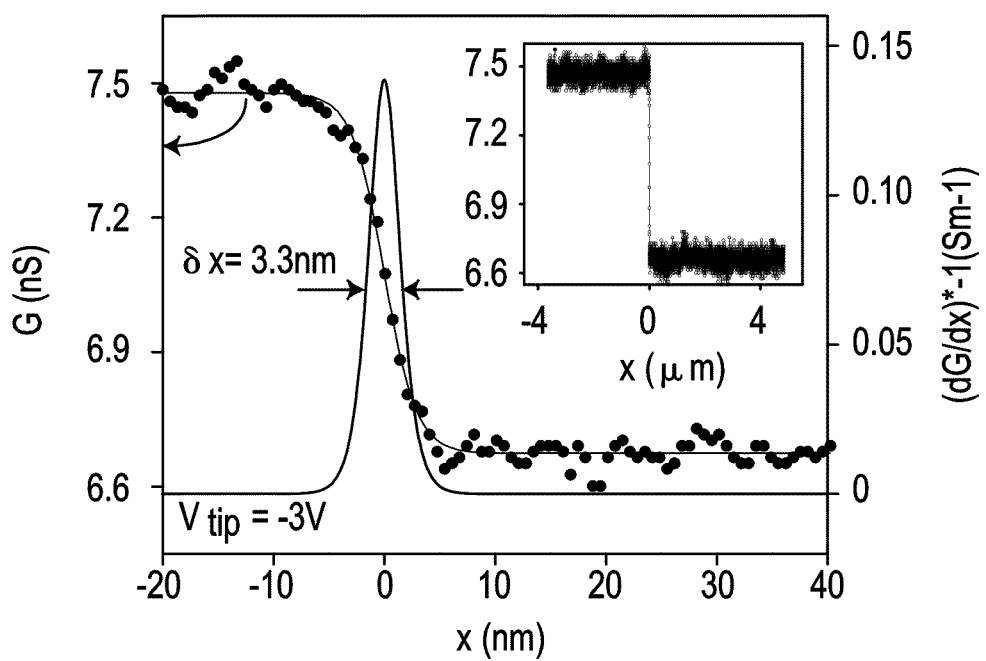
FIG. 2D is a graph of the conductance between the two electrodes (30, 40) as a function of the tip (20) position across the wire (50), while cutting the wire with the tip biased at −3V. A sharp drop in conductance is observed when the tip passes the wire (50). Inset shows the conductance measured over the entire 8 µm scan length. The decrease in conductance can be fitted to a profile $G(x)=G_0-G_1\tanh(x/h)$. The deconvoluted differential conductance $(dG/dx)^{-1}$, shows a full width at half maximum $\delta x=3.3$ nm.

The embodiments of the present invention also provide a method for measuring the transverse dimension of a conducting nanowire. As shown in FIG. 2C, the nanowire can be "cut" by applying a reverse voltage to the tip of the AFM (V$_{tip}$=−3 V), although other tools such as electron beam lithography or nanoscale electrodes may also be used for this purpose. Thus, as the AFM tip (20) crosses the wire, the measured conductance decreases abruptly as seen from the graph in FIG. 2D. Assuming that this erasure process has a resolution comparable to the writing process, the diameter of the nanowire can be determined from the plot of the deconvolved differential profile (dG/dx) as a function of tip position. Importantly, subsequent writing over the affected area with positive voltages (for example, V$_{tip}$=+3 V) restores the conductivity of the nanowire. Furthermore, there are several technological advantages for the small size of structures that can be created (nanowires and quantum dots) using the above method. For example, devices capable of performing all essential electronic functions on a single chip can be formed. Both active elements such as FETs and passive elements, such as resistors and capacitors, are easily fabricated, while inductors can also be created using conductive loops around magnetic particles. In fact, the method allows for non-volatile on/off states, enabling reconfigurable logic and memory devices.

Additional applications for the nanoscale devices include single-electron transistors (SETs) that operate at room temperature. SET's require ultra-small capacitance quantum dots, namely, dots smaller than 10 nm to operate at room temperature. Quantum dots having these dimensions are already within the reach using the method embodiments.

Another application of the embodiments of the invention is hard drive data storage for computers. The embodiments provide a method of creating nanoscale devices that permit high density data storage. For example, nanowires with a width in the range from about 3.3 nm to about 10 nm can be formed. To demonstrate the high degree of spatial resolution of such structures, an array of "dots" was created by pulsing the oxide heterostructure using the tip of a conducting AFM. This allowed small isolated "puddles" of conducting electrons that form locally at the interface between the two insulating layers. The resultant array of q-0DEG quantum dots was visualized using Kelvin probe microscopy for analyzing the spatial resolution of the array of dots.

In another embodiment, a linear array of "quantum dots" (70) is written as shown in FIG. 3A. Dots were created by applying voltage pulses V$_{tip}$(t) having an amplitude V$_{pulse}$ and pulse duration t$_{pulse}$ to the tip (20) of the AFM while keeping the tip position fixed. The size of the dots created depends on the amplitude as well as the duration of the applied pulse. In one exemplary embodiment, V$_{pulse}$ was fixed at 10 V while the duration of the pulse was varied to change the size of the dots. To determine the effective dot size a linear array of dots at various separation distances "d" between two adjacent dots was created. The two ends of the linear array are then contacted to two conducting electrodes and the conductance between the two electrodes is monitored using a lock-in amplifier. If the spacing between the dots is greater than the dot diameter, the dots do not overlap and no increase in conductance is observed. However, once the spacing between dots becomes equal to or less than the dot diameter, the linear array will form a conducting wire, and an abrupt increase in conductance between the two electrodes (ΔG) is observed.

Figure 3B:
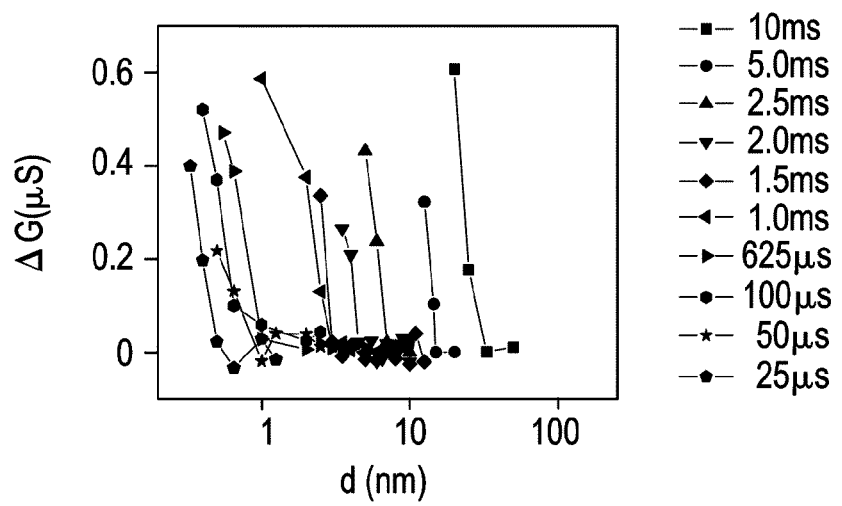
FIG. 3B is a graph of the conductance change as a function of dot spacing for an array of conductive quantum dots written using pulses of different durations and connecting the electrodes (30, 40).

FIG. 3B graphically depicts the resultant change in conductance as a function of separation distance "d" between dots for different durations of the pulse, ($t_{pulse}$) applied with the tip of the AFM. As seen in FIG. 3B, a sharp metal-insulator transition is observed as the dot spacing is reduced. For dot array's created using pulses of longer duration, the metal-insulator transition occurs at a relatively larger separation distance "d," while for the arrays created with pulses of shorter duration, the metal-insulator transition occurs at a smaller separation distance "d" between dots. Thus, pulses of a short duration result in smaller dots which would allow a higher density of the conducting quantum dots to be created in a given area. This would translate to media (chips) capable of ultra high density data storage.

Figure 3C:
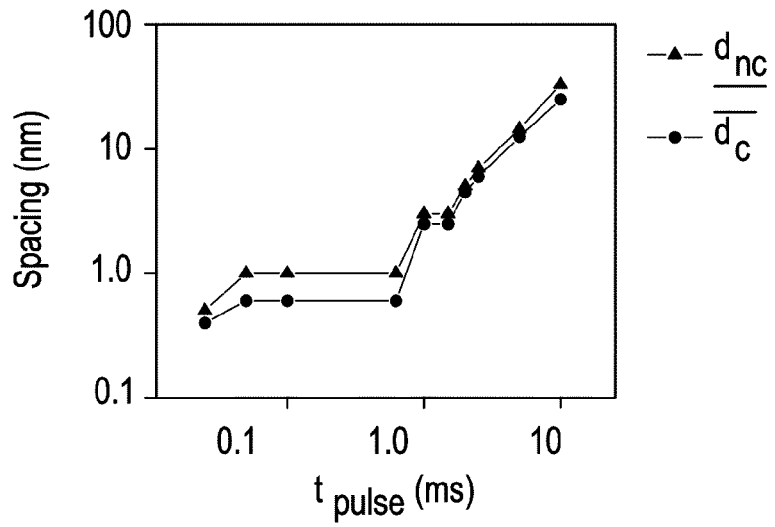
FIG. 3C is a plot of minimum dot spacing for which the array is non-conducting $d_{nc}$ and the maximum dot spacing for which the array is conducting $d_c$, presented as a function of pulse duration $t_{pulse}$.

FIG. 3C depicts plots of the smallest non-conducting spacing ($d_{nc}$) and the largest conducting spacing $d_c$ between dots as a function of $t_{pulse}$. The critical spacing for conduction "$d_c$" scales linearly with pulse duration until pulse durations of less than a millisecond are used ($t_{pulse}$<1 ms). Below this threshold for pulse duration, the critical spacing between dots in a linear array levels off at a distance $d_c$~1 nm.

By way of an example, it should be noted that a spacing between quantum dots of 7 to 15 nm, corresponds to data storage capacity of >3 Tb/in$^2$. Since the embodiments of the invention provide dot spacing of less than 2 nm, an improvement over the magnetic storage materials currently used in hard disk drives is provided. In some embodiments, the method of the present invention allows creating small size structures (e.g., nanowires and conductive quantum dots). Thus, one might call the present invention a "nanoelectronic sketchpad" or "quantum etch-a-sketch."

In yet another embodiment, the width of the conducting wire depends on the voltage of the AFM's tip ($V_{tip}$). Increasing $V_{tip}$ from 3 V to 10 V increases the width of the conducting wire by three orders of magnitude. Test measurements have shown that the conductive wires created using an AFM tip remain stable over a 24 h time interval after the removal of the external electric field. Thus, it is possible to create nanoscale conducting structures in devices at room temperature using the method of the instant invention. Importantly, the nanoscale devices can find use in various technological applications based on quantum mechanics, such as, single-electron transistors, ultra-high density data storage and devices involving spin-based quantum computing architecture.

Figure 4A:
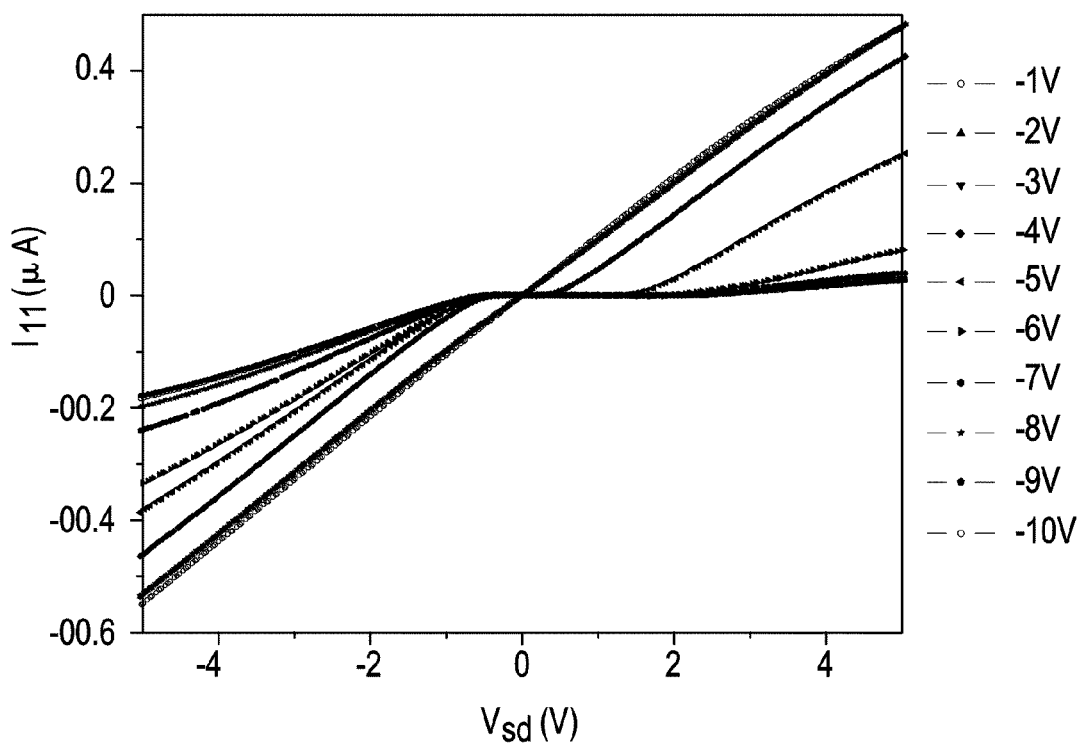
FIG. 4A is a plot of the current-voltage characteristics of a LaAlO$_3$/SrTiO$_3$ interface. The current $I_{II}$ is plotted as a function of the source-drain voltage ($V_{sd}$) for a 20 µm long q-1DEG wire with a potential barrier near the center and created with a negative gate bias $V_{gate}$. Different tip biases are represented. At sufficiently high tip bias, the I-V characteristic becomes strongly non-linear.
Figure 4B:
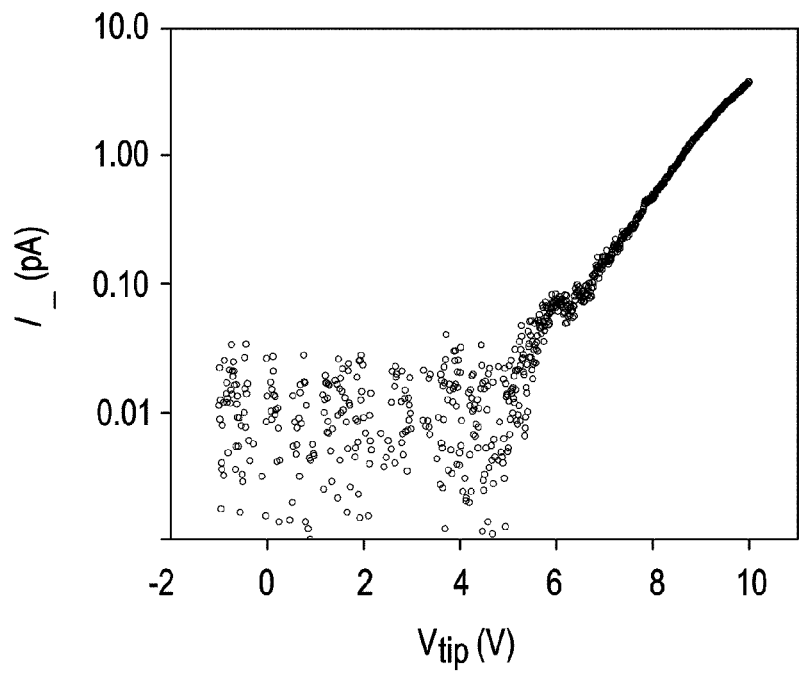
FIG. 4B is a plot of the AFM tip current I versus tip voltage $V_{tip}$ with respect to grounded interface.

In still another embodiment, the present invention discloses creating "non-volatile" field-effect transistors (FET). Accordingly, in one exemplary embodiment, the oxide heterostructure is contacted with a set of electrodes at the interface of the two insulating layers. One electrode serves as the source while the second electrode functions as the drain of the FET. A conducting wire is written between the two electrodes and is in contact with the electrode at its opposite ends. The conducting tip of an AFM is then used to perturb the conductance through the application of an external electric field. FIG. 4A shows the current-voltage (I-V) characteristics of a q-1DEG wire, that is being perturbed by the AFM probe at varying voltages. Each curve in FIG. 4A represents a different applied voltage ($V_{gate}$) for the AFM probe. For each bias of the AFM tip, the in-plane current $I_{||}$ is measured (using a picoammeter referenced to virtual ground) as a function of the source-drain voltage ($V_{sd}$) applied to one of the electrodes. At low |$V_{gate}$|, the conductance of the nano wire is unaffected. However, as the AFM tip bias becomes more negative (opposite to the writing voltage for the nano wire), the wire becomes insulating and conducts only above a finite bias. This turn-on bias increases monotonically with |$V_{gate}$|. Eventually the I-V curve becomes asymmetric, the probable origin of which is an asymmetry in the insulating barrier profile, produced by unequal electric fields on both sides of the AFM tip. However, this effect is semi-permanent. The conducting nature of the wire can be restored by removing the AFM probe.

The embodiments of the present invention allow creating exceptionally small sized electrically conductive regions in a reproducible manner using the tip of a conducting AFM as a source for applying the external electric field. In a preferred embodiment, a voltage-biased AFM tip is used to produce large local electric fields (E~$V_{tip}$/L) across the L=1.2-nm-thick LaAlO$_3$ barrier, although electron beam lithography or nanoscale electrodes placed in, over, or under one of the insulating layers can also be used in place of AFM to provide the external electric field. This permits creating exceptionally small sized q-1 or 0-dimensional electron gas regions with high spatial resolution.

In yet another embodiment, the instant invention discloses fabricating nanowires that can themselves act as gates of a FET. The nanowires are formed either above, below or the sides of a transistor channel region and separated from the conducting channel by a layer of insulating material, such as the perovskite insulating layer on which the nanowires are formed. The gate nanowire can be connected to a voltage or current source, such as a conductive pad connected to a voltage or current source or to a gate driver circuit. Additionally, the channel may comprise a semiconductor region in a semiconductor layer that is located adjacent to the nanowire. Alternatively, the channel is another q-1DEG nanowire located adjacent to the "gate" nanowire. In this set-up, the "channel" nanowire can be connected to the source and drain electrodes, which may comprise other conductive pads connected to a voltage or current source or to a bit line driver circuit.

The present embodiments of the invention also provide material systems wherein the LaAlO$_3$/SrTiO$_3$ oxide heterostucture is grown on silicon and a nanowire is used as a gate to form very high mobility devices in silicon-on insulator or strained silicon-on insulator platforms.

The instant invention also provide various uses for the LaAlO$_3$/SrTiO$_3$ material systems for technological applications. In a preferred embodiment, the present invention contemplates the use of devices in silicon-on insulator, strained silicon-on insulator or germanium-on insulator platforms as ultra-high density non-volatile data storage devices, as single electron transistors or the use of the devices for a variety of quantum computing applications.

The present invention is generally described by reference to the following examples which are illustrative only, and are not intended to be limiting.

EXAMPLES

The material system comprising LaAlO$_3$/SrTiO$_3$ heterostructure was obtained from the Center for Electronic Correlations and Magnetism, Institute of Physics at the University of Augsburg (Ausgburg, Germany). Briefly, the oxide heterostructure is made by growing a LaAlO$_3$ layer on to a TiO$_2$ terminated insulating SrTiO$_3$ substrate at 770° C. in an oxygen atmosphere at a pressure of 6×10$^{-5}$ mbar, using pulsed laser deposition. The samples are then cooled to 600° C. in the presence of oxygen at a pressure of 400 mbar for 1 h to give the material system comprising an oxide heterostructure. The thickness of the LaAlO$_3$ layer was varied based on the requirements for the measurements to be performed.

Control experiments were performed on 4 unit cells ("uc") LaAlO$_3$/SrTiO$_3$ and 2 uc LaAlO$_3$/SrTiO$_3$, and 0 uc LaAlO$_3$/SrTiO$_3$ (i.e., bare SrTiO$_3$) samples. Each of these samples was grown and contacted in a manner identical to that described for the 3 uc LaAlO$_3$/SrTiO$_3$ with the exception of the bare SrTiO$_3$, on which LaAlO$_3$ was not grown. A summary of results for all four samples (including 3 uc LaAlO$_3$/SrTiO$_3$) is provided in Table 1.

Photosensitivity. The conductance of the 3 uc LaAlO$_3$/SrTiO$_3$ sample is highly sensitive to light above the bandgap of SrTiO$_3$ (~3.2 eV). The 3 uc LaAlO$_3$/SrTiO$_3$ sample exhibits a persistent photoconductivity that decays over ~12-24 hours after being stored in a dark environment. The 4 uc sample showed a similar photosensitivity, but the 2 uc and 0 uc samples did not exhibit photosensitivity.

Background conductance: The 0 uc, 2 uc and 3 uc sample exhibited very small background conductance of several nS, while the 4 uc sample showed a much larger background conductance (~1200 nS).

Writing conducting regions: Two methods of writing were demonstrated with the 3 uc sample: (1) writing of isolated structures that are later contacted, and (2) writing of structures beginning from one or both electrodes. Writing (using either method) for the 4 uc sample is possible although the large conductance of the interface requires the voltage threshold for writing to be higher compared to the 3 uc sample. Isolated conducting structures could not be written on either the 2 uc or the 0 uc sample. Attempts to write conducting lines beginning from one of the electrodes and ending at the other were unsuccessful in that any resulting conductance change coincided with highly visible damage to the sample surface, taking the form of a 1-2 nm protruding line that follows the path taken by the AFM tip. It should be further noted that writing for the 3 uc or 4 uc samples did not produce any observable topographic changes.

Erasing conducting regions: In 3 uc sample, conducting regions became insulating after being erased by the application of a reverse voltage (−10 V). However, for the 4 uc sample, only changes in the conductance were observed after several attempts to erase the conducting region. The interface, however, remains conducting regardless of the bias applied.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents.

TABLE 1

| | LaAlO$_3$ layer thickness | | | |
| --- | --- | --- | --- | --- |
| | 0 uc | 2 uc | 3 uc | 4 uc |
| Photosensitive? | No | No | Yes | Yes |
| Background conductance | <10 nS | <10 nS | <10 nS | >1 μS |
| Write isolated structure? | No | No | Yes | Yes* |
| Write connected structure? | Not possible without producing damage | Not possible without producing damage | Possible for V$_{tip}$ > 3 V | Possible for V$_{tip}$ > 7 V |
| Topography change after writing | Yes | Yes | No | No |
| Cut with V$_{tip}$ = −10 V | NA | NA | Yes | Yes*, after several attempts |

*For the 4 uc sample, writing and cutting procedures only modulate the conductivity. The interface is always conducting.

What is claimed is:

1. A reconfigurable device comprising:
   (A) a first insulating layer and a second insulating layer and, at an interface between said first and second insulating layers,
   (B) an electrically conductive, quasi one- or zero-dimensional electron gas, such that said interface presents an electrically conductive region that is non-volatile,
   wherein said second insulating layer is of a thickness to allow metal-insulator transitions upon the application of a first external electric field,
   wherein said electrically conductive region is subject to erasing upon application of a second external electric field, and
   wherein the electrically conductive region has a width or diameter in the range of about 3.3 nm.

2. The reconfigurable device of claim 1, wherein the electrically conductive region forms a nanowire or a quantum dot.

3. The reconfigurable device of claim 1, wherein the electrically conductive region has a length of about 100 nm to about 100 um.

4. The device of claim 1, wherein the electrically conductive region comprises a gate of a transistor, a channel of a transistor, a data storage region of a data storage device, an interconnect or electrode of an electronic device or a conductive region of a passive electronic device.

5. The reconfigurable device of claim 1, wherein the first insulating layer comprises a non-polar oxide material and the second insulating layer comprises polar oxide material that overlays the first insulating layer.

6. The reconfigurable device of claim 5, wherein the two insulating layers comprise materials having perovskite structures which are different from each other.

7. The reconfigurable device of claim 5, wherein the non-polar oxide material comprises SrTiO$_3$ and the polar oxide material is selected from the group consisting of LaTiO$_3$, LaAlO$_3$, LaVO$_3$ and KTaO$_3$.

8. The reconfigurable device of claim 5, wherein the thickness of the polar oxide material is three unit cells.

9. A method of making or using a reconfigurable device that comprises:
   (A) a first insulating layer and a second insulating layer and, at an interface between said first and second insulating layers,
   (B) an electrically conductive, quasi one- or zero-dimensional electron gas, such that said interface presents an electrically conductive region that is non-volatile,
   wherein said second insulating layer is of a thickness to allow metal-insulator transitions upon the application of a first external local electric field,
   wherein the method comprises
   (i) providing a first external local electric field adjacent to said interface to create the electrically conductive, quasi one- or zero-dimensional electron gas, said electrically conductive region being subject to erasing upon application of a second external local electric field, and (ii) erasing the electrically conductive region by applying the second external local electric field adjacent to the electrically conductive region, wherein the second external local electric field is of an opposite polarity to the first external local electric field.

10. The method of claim 9, wherein the first external local electric field is applied by a tip of an atomic force microscope (AFM).

11. The method of claim 9, wherein the first external local electric field is applied by an electron beam or by a nanoscale electrode.

12. The method of claim 9, wherein the first and the second external local electric fields are applied to the interface through one of the first and second insulating layers.

13. The method of claim 9, wherein the first and second insulating layers comprise $LaAlO_3$ and $SrTiO_3$ and the first external local electric field is applied through the $LaAlO_3$ layer.

14. The method of claim 9, wherein the electrically conductive region retains its conductivity for at least 12 hours to provide a useful function, after the withdrawal of the first external local electric field.

15. The method of claim 9, further comprising reconfiguring the reconfigurable device by selectively creating or erasing multiple electrically conductive regions using external local electric fields.

16. A reconfigurable device comprising:
(A) a first insulating layer and a second insulating layer and, at an interface between said first and second insulating layers,
(B) an electrically conductive, quasi one- or zero-dimensional electron gas, such that said interface presents an electrically conductive region that is non-volatile,
wherein said second insulating layer is of a thickness to allow metal-insulator transitions upon the application of a first external electric field, wherein said electrically conductive region is subject to erasing upon application of a second external electric field,
wherein the first insulating layer comprises a non-polar oxide material and the second insulating layer comprises polar oxide material that overlays the first insulating layer, and
wherein the thickness of the polar oxide material is three unit cells.

* * * * *